(12) United States Patent
Ikemoto et al.

(10) Patent No.: US 6,436,487 B1
(45) Date of Patent: Aug. 20, 2002

(54) METHOD FOR DEPOSITING A SILICON OXIDE FILM

(75) Inventors: Manabu Ikemoto, Sagamihara; Katsuhisa Yuda, Tokyo, both of (JP)

(73) Assignees: Anelva Corporation; NEC Corporation, both of Tokyo (JP)

( * ) Notice: Subject to any disclaimer, the term of this patent is extended or adjusted under 35 U.S.C. 154(b) by 22 days.

(21) Appl. No.: 09/612,615

(22) Filed: Jul. 6, 2000

(30) Foreign Application Priority Data

Jul. 8, 1999 (JP) .......................................... 11-194261

(51) Int. Cl.$^7$ ................................................. B05D 3/14
(52) U.S. Cl. ............. 427/563; 427/255.29; 427/255.37; 427/579; 427/585
(58) Field of Search ................................ 427/579, 585, 427/255.37, 255.29, 563

*Primary Examiner*—Bernard Pianalto
(74) *Attorney, Agent, or Firm*—Oliff & Berridge, PLC (57) ABSTRACT

In a film deposition process wherein a plasma generation chamber is divided from a deposition chamber, radicals are extracted from the plasma generation chamber to the deposition chamber and caused to react with a process gas to form a silicon oxide film. The deposition apparatus has a host controller for dictating a pattern of control of the process gas flow to an MFC provided in a feed part for feeding the process gas into the deposition chamber. The host controller gives the MFC instructions for executing control to, in a first half side time constituting not more than half of the whole film deposition time, first make zero or limit and then gradually increase the process gas flow. The process gas flow in the first half side time can also be limited so that the thickness of film deposited in the first half side time is not greater than 10% of the overall thickness of the silicon oxide film. A silicon-hydrogen compound ($Si_nH_{2n+2}$ (n=1, 2, 3, . . . )) is used as the process gas.

11 Claims, 6 Drawing Sheets

Fig. 2

$t_0$ : O₂ PLASMA DISCHARGE START
$t_1$ : SiH₄ SUPPLY START
$t_2$ : SiH₄ SUPPLY REACHES CONSTANT VALUE
$t_e$ : DEPOSITION AND PLASMA DISCHARGE END

( FOR CONSTANT O2 PLASMA CONDITIONS, SUBSTRATE SURROUNDING PRESSURE AND ELECTRODE GAP.)

METHOD FOR DEPOSITING A SILICON OXIDE FILM

BACKGROUND OF THE INVENTION

1. Field of the Invention

The present invention relates to a method and an apparatus for depositing a silicon oxide film. In particular, the invention is applicable to a film deposition apparatus wherein a plasma generation chamber is divided from a deposition chamber, radicals are extracted from the plasma generation chamber to the deposition chamber, and a thin silicon oxide film is deposited on a substrate by the radicals being made to react with a process gas including silicon atoms supplied to the deposition chamber. In this deposition apparatus, the supply rate of the process gas in an initial stage after deposition is started, that is, in a first half side time constituting not more than half of the whole film deposition time, is limited.

2. Description of the Related Art

There have been deposition apparatuses wherein a deposition chamber and a plasma generation chamber are spatially divided and the deposition chamber and the plasma generation chamber each form a separate space. The divided structure of the deposition chamber and the plasma generation chamber in this kind of deposition apparatus prevents the plasma from making contact with the substrate. Only a gas for plasma generation is fed to the plasma generation chamber, and there a plasma discharge occurs under predetermined conditions and neutral active radicals are created. A process gas for film deposition is fed to the deposition chamber, and the above-mentioned radicals are also supplied to the deposition chamber through multiple holes formed in a partition disposed between the deposition chamber and the plasma generation chamber. Film deposition on a substrate in the deposition chamber is based on CVD (Chemical Vapor Deposition) resulting from a reaction between the radicals and the process gas. In the deposition of a silicon oxide film using this CVD method, a gas including silicon atoms is used as the process gas. The process gas is mixed with the radicals in the deposition chamber. As necessary, a carrier gas is also introduced. The process gas including silicon atoms is for example a silicon-hydrogen compound.

In related art methods for depositing a silicon oxide film, the flow of the process gas fed to the deposition chamber has normally been so controlled that from the start of plasma discharge to the end of plasma discharge (i.e. for the whole film deposition time) the flow is held to a required constant value determined by deposition conditions. Also, in the silicon oxide film deposition method discussed above, to raise the deposition rate to improve productivity and practicality, the flow of the process gas fed to the deposition chamber in the film deposition immediately following the start of plasma discharge has been set to a relatively high value.

However, as another side to this, when the supply rate at which the process gas is supplied in the film deposition immediately following the start of plasma discharge is too great, a silicon oxide film containing excess silicon is deposited. Silicon in the silicon oxide film produces an effect of carrier trap levels. Consequently, with a silicon oxide film including excess silicon, because a great many carrier trap levels are formed in the film, its electrical characteristics are poor. And when a silicon oxide film including excess silicon is used in a semiconductor device, the device characteristics deteriorate markedly.

Specifically, when a silicon oxide film including excess silicon is used as a gate insulating film of a TFT, the problem arises that the operating characteristics of the TFT fluctuate.

Considering this problem, to make good the device characteristics in the formation of the silicon oxide film, the flow of silicon atoms at the time of the plasma discharge should be set to a low value. In fact, J. Batey et al. have proposed in an article of theirs that to improve the electrical characteristics of a silicon oxide film it is effective to make the deposition rate of the silicon oxide film low (J. Appl. Phys. 60(9), Nov. 1, 1986). This article states as a conclusion that it is not possible to form a silicon oxide film having good electrical characteristics unless the film deposition rate is set to 0.13 nm/sec or less. However, because when the deposition rate is made 0.13 nm/sec or less like this the formation of the film takes time, from the point of view of practicality it is difficult to adopt this low deposition rate.

SUMMARY OF THE INVENTION

It is therefore an object of the present invention to provide a method and an apparatus with which it is possible to deposit a silicon oxide film having good electrical characteristics and which are effective from the practical application point of view.

A silicon oxide film deposition method provided by the invention is a method for forming a silicon oxide film on a substrate by generating a plasma in a plasma generation chamber divided from a deposition chamber, extracting radicals in the plasma from the plasma generation chamber to the deposition chamber, and causing these radicals to react in the deposition chamber with a process gas including silicon atoms fed to the deposition chamber. In this film deposition method, the supply rate of the process gas is, in a first half side time constituting not more than half of the whole film deposition time, first limited to zero or another desirably low supply rate and then controlled to gradually increase. The process gas supply rate in the first half side time can also be limited so that the thickness of film formed by the deposition in the first half side time is not greater than 10% of the overall thickness of the silicon oxide film.

In this method for depositing a silicon oxide film, a silicon-hydrogen compound ($Si_nH_{2n+2}$ (n=1, 2, 3, . . . )) is preferably used as the process gas. An inert gas (a noble gas such as Ar) can also be introduced as a diluting gas along with the silicon-hydrogen compound process gas. In this case, the mixture proportions of the process gas and the inert gas can be determined freely.

And in this method for depositing a silicon oxide film, as the pattern of control of the increase of the process gas supply rate, preferably the increase is controlled in correspondence with time or is controlled on the basis of any of a linear function, a second-order function, an exponential function or a step function.

The rate at which the silicon oxide film is deposited in the first half side time constituting not more than half of the whole film deposition time is preferably not greater than 0.13 nm/sec.

As the gas for producing the radicals, any gas from among $O_2$, $O_3$, $N_2O$, $CO$, $CO_2$ and nitrogen oxide gases is used.

In a silicon oxide film deposition apparatus according to the invention, radicals are extracted to a deposition chamber from a plasma generation chamber divided from the deposition chamber, and in the deposition chamber the radicals are caused to react with a process gas including silicon atoms to deposit a silicon oxide film on a substrate. A feed part for feeding the process gas to the deposition chamber is provided between a process gas supply and the deposition chamber, and a mass flow controller (MFC) is provided in the feed part. The mass flow controller regulates the flow of the process gas supplied to the deposition chamber. A value determining the flow of the process gas is set in the mass flow controller. A host controller for issuing instructions to the mass flow controller dictating this set value determining the flow of the process gas is also provided. This host controller controls the process gas supply device rate by way of the mass flow controller. That is, the host controller, in a first half side time constituting not more than half of the whole film deposition time, first sets to zero or limits the process gas supply rate and then gradually increases it. The host controller may also limit the process gas supply rate in the first half side time so that the thickness of film deposited in the first half side time is not greater than 10% of the overall thickness of the silicon oxide film.

In this deposition apparatus, a silicon-hydrogen compound ($Si_nH_{2n+2}$ (n=1, 2, 3, ...)) is preferably used as the process gas. An inert gas (a noble gas such as Ar) can also be introduced as a diluting gas along with the silicon-hydrogen compound process gas. In this case, the mixture proportions of the process gas and the inert gas are freely determinable.

According to the invention, the feed rate of the process gas used for the deposition of the silicon oxide film is limited in a first half side time constituting not more than half of the whole film deposition time. The partial pressure of $SiH_4$ or the like in the deposition chamber is lowered in the first half side time constituting not more than half of the whole film deposition time, and as a result the deposition rate of the silicon oxide film is suppressed and a state of excess silicon in the silicon oxide film is prevented. When a state of excess silicon is prevented, carrier trap levels in the silicon oxide film are reduced, and the film quality is improved. Also in the first half side time constituting not more than half of the whole film deposition time, the flow of the process gas is gradually increased on the basis of any of various patterns of control. By this means the deposition rate is increased, the overall time required for film deposition is shortened, the productivity of the film is raised, and the practicality of the deposition method or the deposition apparatus is raised. The supply rate of the process gas including silicon atoms is only limited for an initial period immediately following the start of plasma discharge, and thereafter the process gas supply rate is increased in any of various patterns of variation. When the formation of regions of SiO containing excess silicon in the silicon oxide film is prevented, the number of carrier trap levels is reduced, leak current is reduced and the electrical characteristics of the film are improved.

DETAILED DESCRIPTION OF THE PREFERRED EMBODIMENTS

Preferred embodiments of the invention will now be described with reference to the accompanying drawings. The preferred embodiments described here are examples of specific realizations of the invention, and the technological scope of the invention is not limited to these preferred embodiments.

Figure 1:
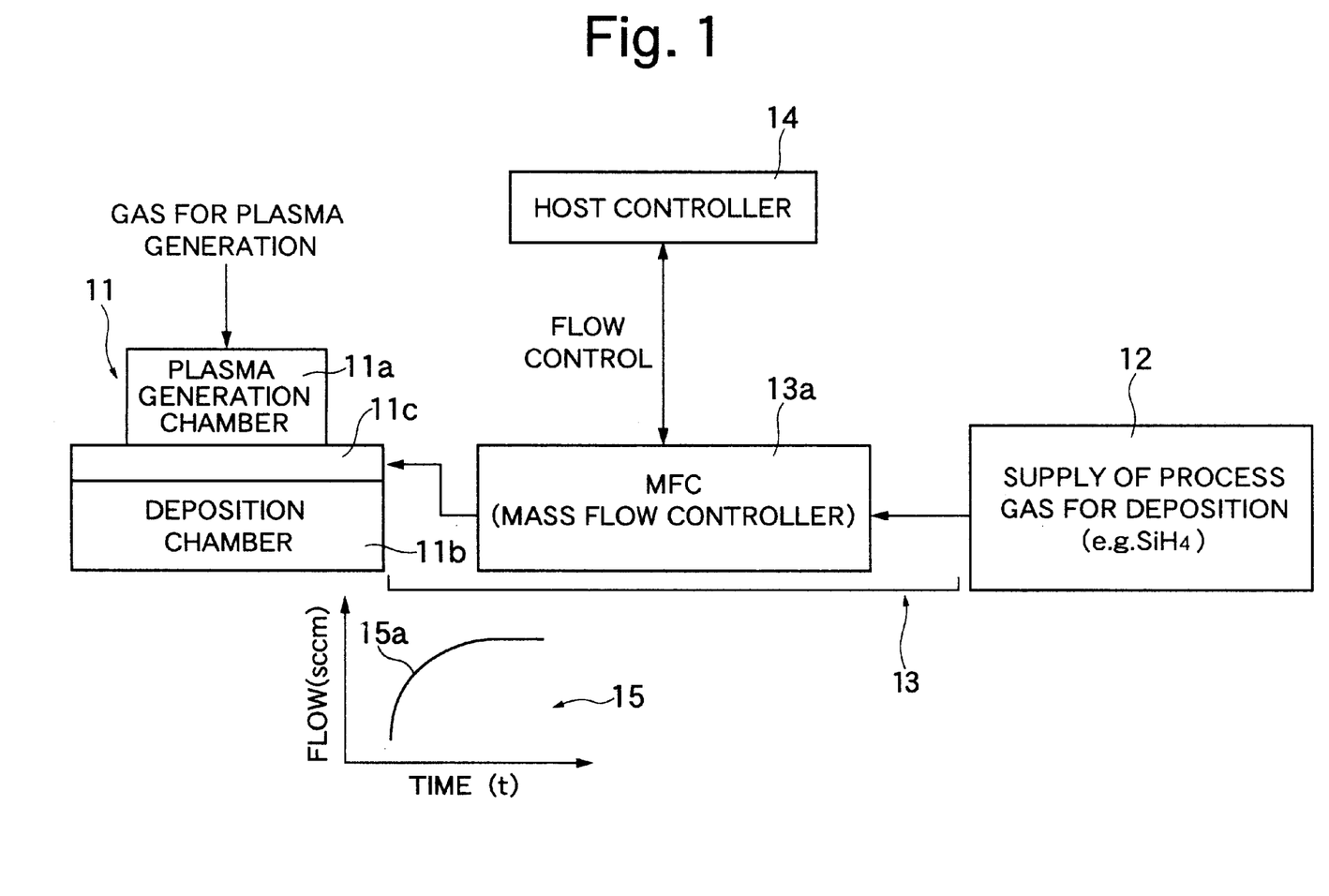
FIG. 1 is a block diagram showing the construction of a silicon oxide film deposition apparatus according to the invention.

Referring to FIG. 1, a film deposition apparatus 11 has a plasma generation chamber 11a and a deposition chamber 11b spatially divided from each other. A structure for separating the plasma generation chamber 11a and the deposition chamber 11b is provided between the two. For example a partition 11c with numerous through holes formed in it is provided between the plasma generation chamber 11a and the deposition chamber 11b. The internal spaces of the plasma generation chamber 11a and the internal space of the deposition chamber 11b are connected by the numerous through holes in the partition 11c.

A gas for plasma generation is introduced into the plasma generation chamber 11a. The gas used for plasma generation is for example any one from among $O_2$, $O_3$, $N_2O$, CO, $CO_2$ and nitrogen oxide gases or is a mixed gas made by suitably mixing two or more of these gases. When the gas for plasma generation is introduced into the plasma generation chamber 11a and for example radio frequency (RF) power from an RF generator (not shown) is also supplied, an electrical discharge is induced and a plasma is generated. When the plasma is generated, neutral active radicals are created in the plasma. Because the above-mentioned partition 11c is provided between the plasma generation chamber and the deposition chamber, charged particles in the plasma are not supplied to the deposition chamber 11b. The partition 11c allows only the radicals to pass through its through holes into the deposition chamber 11b.

A process gas (or source gas) for film deposition is introduced into the deposition chamber 11b. The process gas is introduced only into the inside of the deposition chamber 11b. In the structure of the film deposition apparatus 11, the deposition chamber 11b and the plasma generation chamber 11a are separated by the partition 11c, and by this means the process gas is prevented from coming into contact with the plasma. For example, a process gas feed mechanism is built into the interior of the partition 11c. The process gas is fed into the deposition chamber 11b through the process gas feed mechanism. The process gas feed mechanism is for example made up of a reservoir space for holding the process gas and numerous diffusion holes provided in the deposition chamber 11b.

Figure 9:
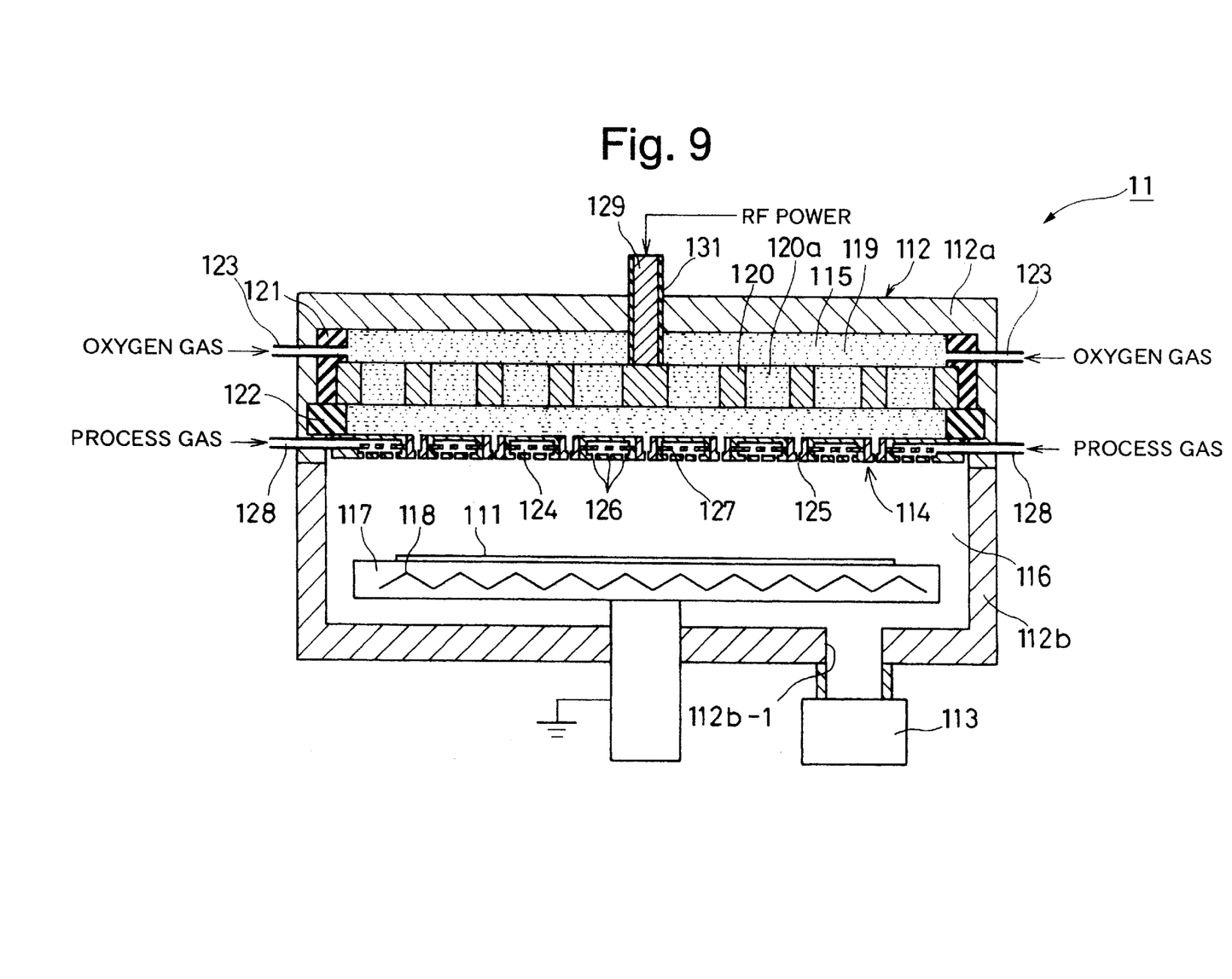
FIG. 9 is a graph showing an example of a specific construction of a deposition apparatus used in the invention.

Here, with reference to FIG. 9, a specific example of a construction of the film deposition apparatus 11 will be described.

This film deposition apparatus 11 is a CVD reactor. In the film deposition apparatus 11, silane is used as a process gas to deposit a silicon oxide film as a gate insulating film on the upper face of a glass substrate 111 for a TFT. When deposition is carried out, the inside of a vessel 112 of the film deposition apparatus 11 is kept in a desired vacuum state by an evacuating mechanism 113. The evacuating mechanism 113 is connected to an exhaust port 112b-1 formed in the vessel 112.

A horizontal partition 114 (equivalent to the partition 11c mentioned above) made from an electrically conducting material is provided inside the vessel 112. The partition 114 is circular and is mounted with its periphery pressed upon by the underside of an annular insulating member 122 so as to form a seal. The inside of the vessel 112 is divided by the partition 114 into two chambers, an upper chamber and a lower chamber. The upper chamber is a plasma generation chamber 115 and the lower chamber is a deposition chamber 116. The partition 114 has a predetermined thickness and as a whole has the form of a flat plate. An internal space 124 is formed in the partition 114.

The glass substrate 111 is disposed on a substrate holding mechanism 117 provided in the deposition chamber 116. The potential of the substrate holding mechanism 117 is kept at a ground potential, which is the same potential as the vessel 112. Also, a heater 118 is provided inside the substrate holding mechanism 117.

The vessel 112 is made up of an upper vessel 112a forming the plasma generation chamber 115 and a lower vessel 112b forming the deposition chamber 116. When the upper vessel 112a and the lower vessel 112b are joined together to make the vessel 112, the partition 114 is installed between the two. The periphery of the partition 14 is mounted so as to make contact with the insulating member 122, which is the lower of two annular insulating members 121, 122 interposed between the partition 114 and the upper vessel 112a when an electrode 120 is installed. By this means, the plasma generation chamber 115 and the deposition chamber 116 are formed separated from each other on the upper side and the lower side of the partition 114. Plasma 119 is generated in the plasma generation chamber 115. Multiple holes 120a are formed in the electrode 120. The partition 114 and the electrode 120 are supported by the two annular insulating members 121, 122 provided around the inner face of the side of the upper vessel 112a. Feed pipes 123 for introducing oxygen gas to the plasma generation chamber 115 from outside are provided in the annular insulating member 121. The feed pipes 123 are connected to an oxygen gas supply source (not shown) via a mass flow controller (not shown) for performing flow control.

Although the inside of the vessel 112 is divided by the partition 114 into the plasma generation chamber 115 and the deposition chamber 116, multiple through holes 125 are formed dispersed in the partition 114, passing through the internal space 124, and only by way of these through holes 125 the plasma generation chamber 115 and the deposition chamber 116 are connected. The internal space 124 of the partition 114 is a space for distributing the process gas and supplying it uniformly to the deposition chamber 116. Multiple dispersion holes 126 for supplying the process gas to the deposition chamber 116 are formed in a lower wall of the partition 114. Feed pipes 128 for introducing the process gas are connected to the internal space 124. The feed pipes 128 are disposed so as to be connected from the side. A baffle plate 127 perforated with multiple holes 127a so that the process gas is supplied uniformly through the dispersion holes 126 is provided inside the internal space 124. The process gas fed into the internal space 124 by the feed pipe 128 enters on the upper side of the baffle plate 127 and passes through the holes 127a of the baffle plate 127 into a space 124b on the lower side, and then passes through the dispersion holes 126 and is dispersed into the deposition chamber 116. An electrode 129 covered on its outside by an insulator 131 is connected to the electrode 120 and supplies RF power thereto.

Returning to FIG. 1, the rest of the film deposition apparatus 11 will now be described. In FIG. 1, the reference numeral 12 denotes an apparatus for supplying the process gas for film deposition. Process gas supplied from this process gas supply 12 passes through a gas feed line 13 including an MFC (Mass Flow Controller) 13a and is fed into the above-mentioned process gas feed mechanism inside the partition 11c. As the process gas, a silicon-hydrogen compound ($Si_nH_{2n+2}$(n=1, 2, 3, ...)) such as $SiH_4$ is used. In the deposition chamber 11b, the process gas introduced through the process gas feed mechanism inside the partition 11c reacts with the radicals introduced via the numerous through holes formed in the partition 11c, the process gas is broken down, and a silicon oxide film is deposited on a substrate placed in the deposition chamber 11b. In this way, a film is formed on the substrate. Preferably, along with the introduction of the process gas, an inert gas (a noble gas such as Ar) is introduced as a diluting gas. The mixture proportions of the process gas and the inert gas are freely determinable.

The above-mentioned MFC 13a has the function of regulating the flow of the process gas through the gas feed line 13. An MFC is essentially a flow control device for supplying a process gas automatically. In this preferred embodiment, on the basis of commands from a host controller, which will be discussed next, the flow of the process gas is regulated to vary the supply rate. In the MFC 13a a set value for governing the flow of the process gas is set, and the flow of the process gas is controlled by this set value being varied with time.

As mentioned above, the host controller 14 feeds to the MFC 13a provided in the gas feed line 13, for example via communication means, commands dictating the pattern of the regulation of the flow of the process gas effected by the MFC 13a. The host controller 14 thereby controls the flow of process gas supplied to the deposition chamber 11b through the MFC 13a. By this means, the supply of process gas fed to the deposition chamber 11b can be controlled by the host controller 14 to a desired value, as will be further discussed later.

It is also possible to provide the MFC itself with a control function for executing the film deposition method of the invention, and to dispense with the host controller. However, as will be further discussed later, because the pattern of the variation of the flow of process gas supplied to the deposition chamber 11b may be subtle and complex, it is preferable for a host controller with a high capability to be provided. When considering an actual design, it is possible to select freely the location of the control means for working a film deposition method, that is, method for supplying process gas, according to the invention.

In the graph 15 shown in FIG. 1, the horizontal axis shows time (t) and the vertical axis shows flow of process gas (sccm), and an example 15a of a variation of process gas flow is shown. In this preferred embodiment, the pattern of the regulation of the process gas flow is controlled on the basis of commands from the host controller 14. That is, specifically, in a first half side time constituting not more than half of the whole film deposition time, the supply rate (flow) of process gas is first set to zero or is limited and then it is gradually increased, so that the supply rate of process gas in the first half side time as a whole is limited.

Next, various methods for the pattern of control of the flow, that is, the supply rate, of the process gas will be described, as first through fourth preferred embodiments.

First Preferred Embodiment

Figure 2:
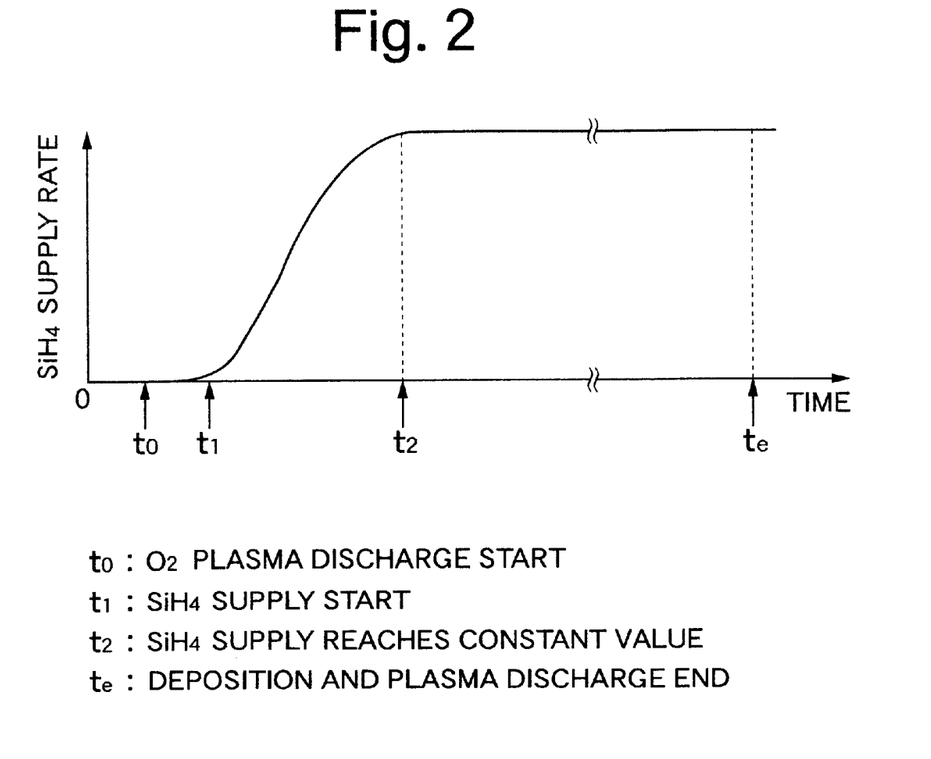
FIG. 2 is a graph showing a first preferred embodiment of a pattern of variation of a process gas supply rate according to the invention.

FIG. 2 shows a representative example of control of the supply rate of the process gas $SiH_4$. In the graph of FIG. 2 the horizontal axis shows time and the vertical axis shows feed flow. Times $t_0$, $t_1$, $t_2$, $t_e$ are set on the time axis. For example oxygen ($O_2$) is used as the plasma generation gas. Time $t_0$ is the time at which the oxygen gas is fed into the plasma generation chamber and plasma discharge of the oxygen gas is started, and is the start time of film deposition. At time $t_1$, the supply of $SiH_4$ is started. Accordingly, from time $t_0$ to time $t_1$, supply of $SiH_4$ is not carried out, and the flow of the process gas at this initial stage is zero. The supply of $SiH_4$ at this initial stage can alternatively be limited to another flow other than zero flow. After that, between times $t_1$ and $t_2$, the supply rate of $SiH_4$ is gradually increased with time, and at time $t_2$ the supply rate of $SiH_4$ reaches a constant value. The supply rate of $SiH_4$ from time $t_2$ to time $t_e$, at which film deposition and plasma discharge end, is kept to this constant value.

By the process gas supply rate in an initial stage after deposition is started being made zero flow or being limited like this, the formation of a silicon oxide film having excess silicon at the start of deposition can be suppressed, and by the process gas supply rate being gradually increased from time $t_1$ to time $t_2$ thereafter, the film deposition time is shortened and practicality is raised. Thus, because the process gas supply rate is first limited and then gradually increased in the time $t_0$ to $t_2$ like this, the process gas supply rate as a whole is limited. The time $t_0$ to $t_2$ satisfies the relationship with respect to the overall deposition time $t_0$ to $t_e$ that $(t_2-t_0)/(t_e-t_0) \leq 0.5$. On the basis of this relationship, the time $t_0$ to $t_2$ is defined as "a first half side time constituting not more than half of the whole film deposition time". In this first half side time constituting not more than half of the whole film deposition time, the process gas supply rate is so limited that the thickness of silicon oxide film formed in the first half side time is not greater than 10% of the overall thickness of the silicon oxide film.

Second Preferred Embodiment

Figure 3:
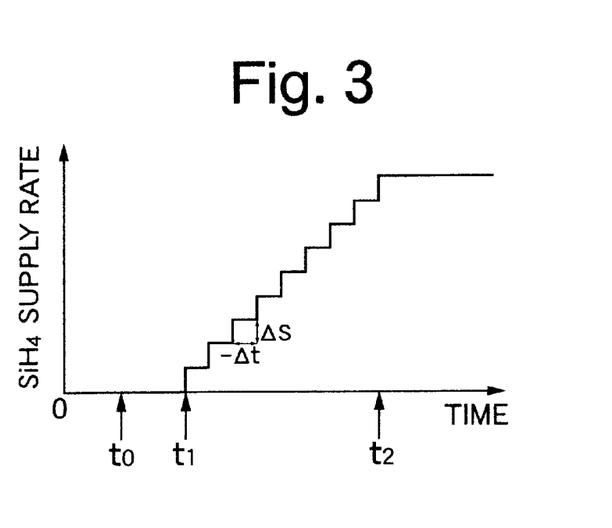
FIG. 3 is a graph showing a second preferred embodiment of a pattern of variation of a process gas supply rate according to the invention.

FIG. 3 shows another example of control of the supply rate of the process gas $SiH_4$. The times $t_0$, $t_1$, $t_2$ on the time axis have the same significance as described above. In this example, control is carried out so that the supply rate from $t_1$ to $t_2$ is increased according to a step function. In this example also, in a first half side time constituting not more than half of the whole film deposition time, by the process gas supply rate first being made zero flow or being limited, the formation of a silicon oxide film having excess silicon is suppressed, and also by the process gas supply rate then being gradually increased according to a step function the film deposition time is shortened and practicality is raised.

Third Preferred Embodiment

Figure 4:
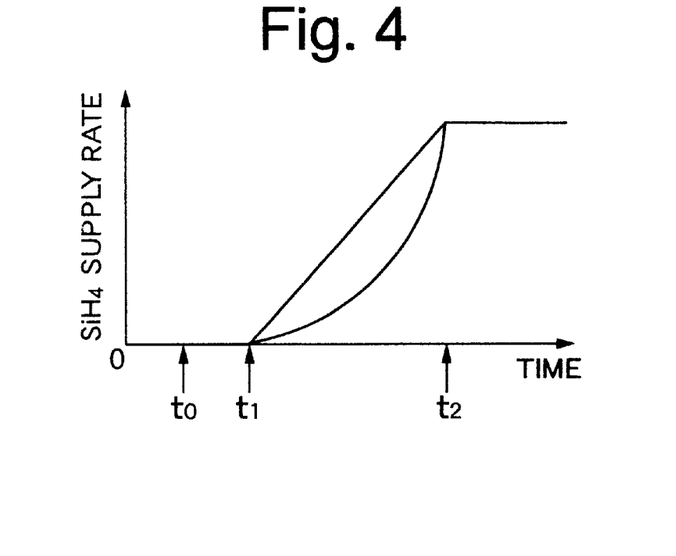
FIG. 4 is a graph showing a third preferred embodiment of a pattern of variation of a process gas supply rate according to the invention.

FIG. 4 shows other examples of control of the supply rate of the process gas $SiH_4$. The times $t_0$, $t_1$, $t_2$ on the time axis have the same significance as described above. In this example, control is carried out so that the supply rate from $t_1$ to $t_2$ is increased according to any of various functions, for example a proportional, linear function, a second-order function, or an exponential function. In this example also, in a first half side time constituting not more than half of the whole film deposition time, by the process gas supply rate first being made zero flow or being limited the formation of a silicon oxide film having excess silicon is suppressed, and also by the process gas supply rate then being increased according to any of various functions the film deposition time is shortened and practicality is raised.

Fourth Preferred Embodiment

Figure 5:
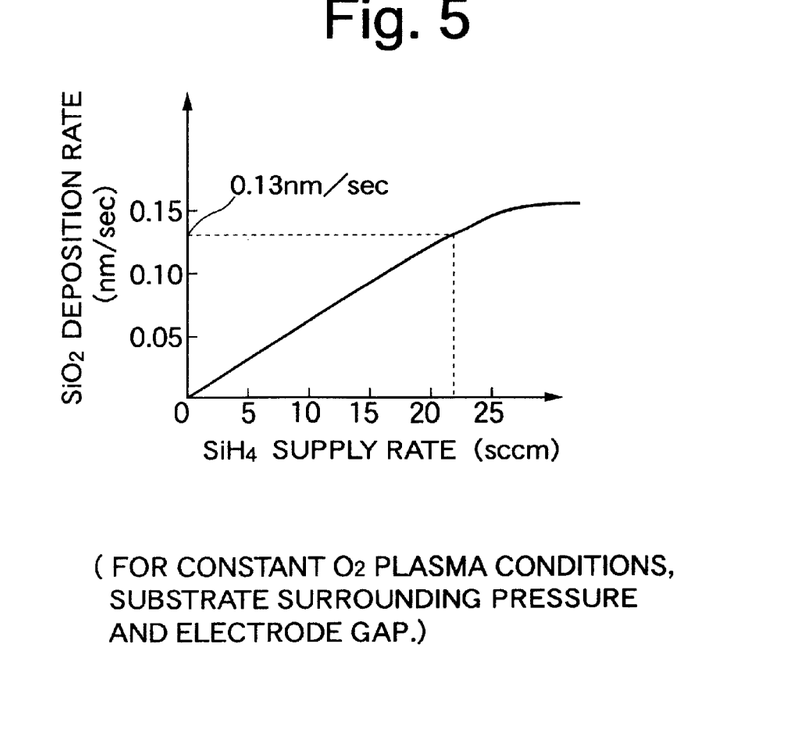
FIG. 5 is a graph showing a relationship between process gas supply rate and deposition rate pertaining to the invention.
Figure 6:
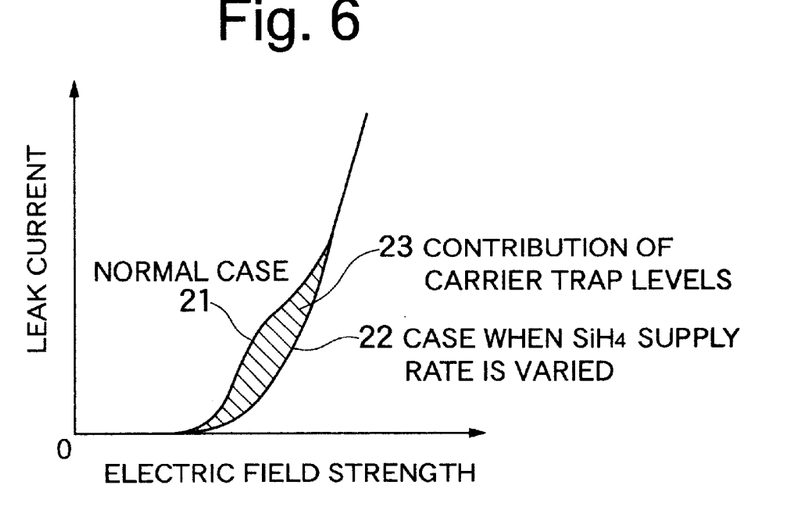
FIG. 6 is a graph illustrating a reduction in carrier trap levels.

FIG. 5 shows a preferable condition for increasing the supply rate of the process gas $SiH_4$. In FIG. 5 the horizontal axis shows supply rate (sccm) of $SiH_4$ and the vertical axis shows film deposition rate of $SiO_2$ (nm/sec). After film deposition is started the supply of $SiH_4$ is started at time $t_1$ and the $SiH_4$ supply rate is gradually increased, as shown in FIGS. 2 through 4, but at this time the $SiH_4$ supply rate is suppressed so that the deposition rate of the film formed on the substrate is not greater than 0.13 nm/sec, as shown in FIG. 5. In this case, the $O_2$ plasma generation conditions, the internal pressure where the substrate is placed and the electrode spacing have all been kept constant. When this is done, when as shown in FIG. 6 the field strength vs. leak current characteristic 21 of a silicon oxide film made by a method and apparatus not according to the present invention and the field strength vs. leak current characteristic 22 of a silicon oxide film made in accordance with the invention are compared, the leak current contribution 23 of carrier trap levels is reduced and carrier trap levels in the silicon oxide film are cut down and the above-mentioned effects are still better obtained.

Figure 7:
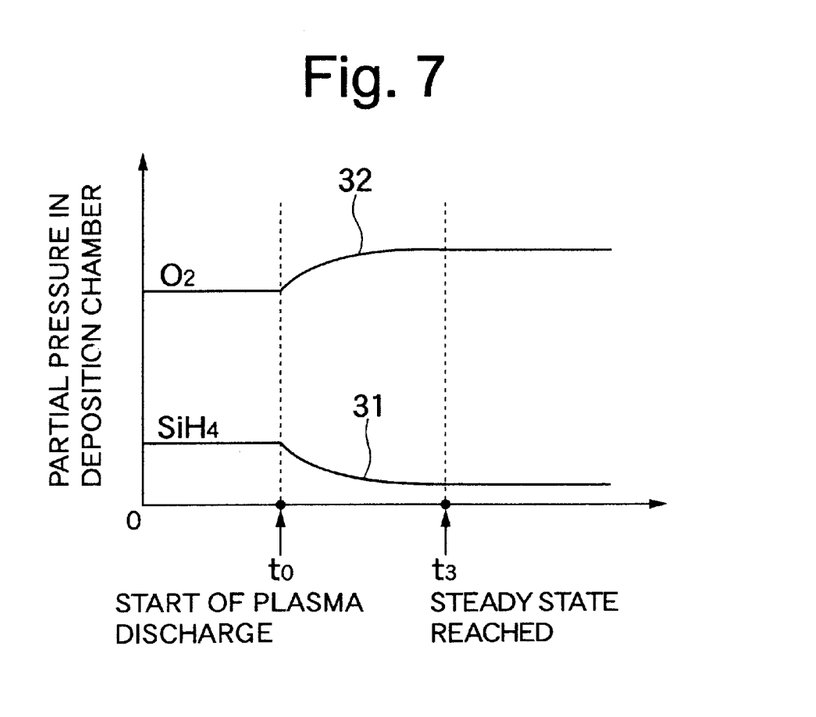
FIG. 7 is a graph showing variations of partial pressure in an $SiH_4$ supply method of related art.
Figure 8:
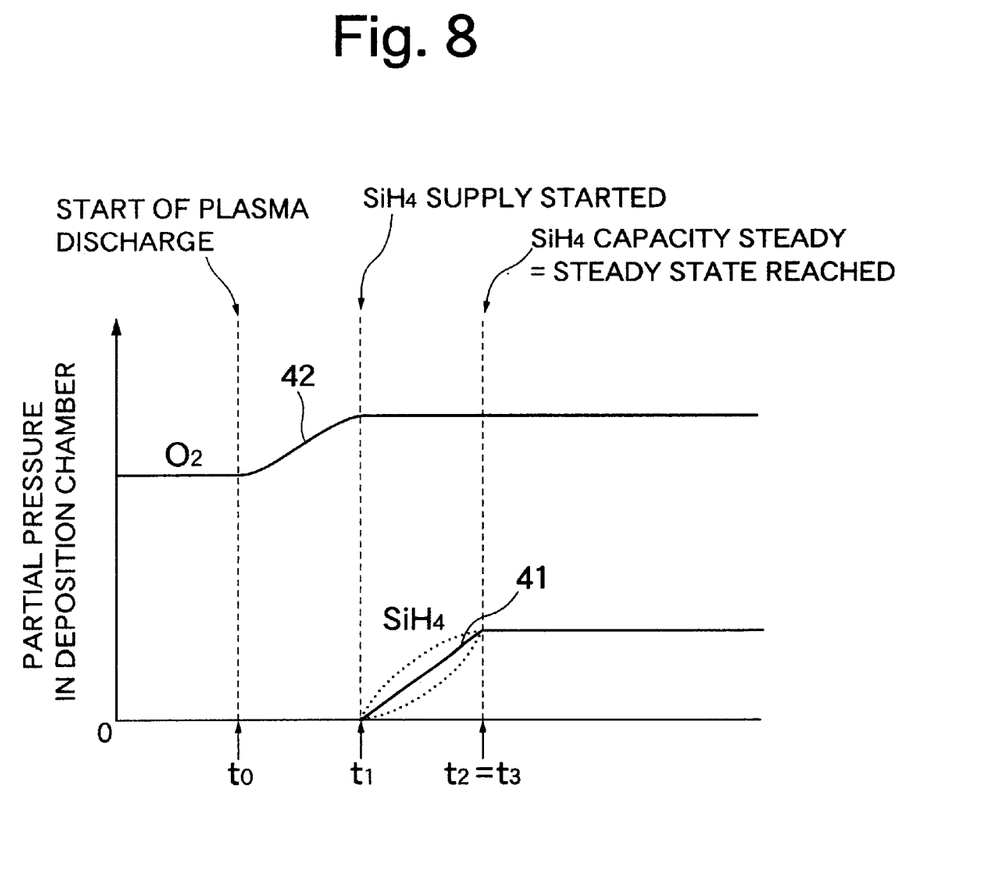
FIG. 8 is a graph showing variations of partial pressure in an $SiH_4$ supply method according to the invention.

Next, with reference to FIG. 7 and FIG. 8, a method for supplying the process gas $SiH_4$ in the first half side time constituting not more than half of the whole film deposition time described in the foregoing preferred embodiments will be explained from the point of view of partial pressure changes. FIG. 8 shows partial pressures in the $SiH_4$ supply method according to the invention. And for contrast, the partial pressure changes in a supply of $SiH_4$ according to a related art method are shown in FIG. 7. In FIG. 7 and FIG. 8, the horizontal axis shows time and the vertical axis shows partial pressure inside the deposition chamber.

FIG. 7 shows a partial pressure characteristic 31 of $SiH_4$ and a partial pressure characteristic 32 of $O_2$. In the partial pressure characteristic 31, before $t_0$, which is the plasma discharge start time, and after $t_3$, which is a steady state arrival time, the partial pressure of $SiH_4$ is constant, and between $t_0$ and $t_3$ the partial pressure falls. The constant partial pressure before $t_0$ is a result of the supply and exhausting of $SiH_4$ being in equilibrium, and the constant partial pressure after $t_3$ is a result of the supply and consumption (exhausting and deposition) of $SiH_4$ being in equilibrium. In the plasma discharge period after to the exhaust rate is constant and the supply of $SiH_4$ is also constant, and consequently, compared with the period after $t_3$, $SiH_4$ is consumed by the amount of the fall in partial pressure, and this consumed amount apparently all contributes to film deposition.

Thus in the period from the discharge start time $t_0$ to the steady state arrival time $t_3$ (the time for which the discharge is in a transient state) the partial pressure of $SiH_4$ (or other process gas including Si) falls, this fall makes a film rich in Si, and in the silicon oxide film a layer including too much silicon is formed in the initial stage after deposition is started.

FIG. 8 also shows a partial pressure characteristic 41 of $SiH_4$ and a partial pressure characteristic 42 of $O_2$. In contrast with the related art supply method described above, in the partial pressure characteristic 41, the partial pressure of $SiH_4$ is kept substantially zero at the discharge start time to, and supply of $SiH_4$ is carried out and its partial pressure gradually raised from a certain time $t_1$ after the discharge start ($t_0$). The feed rate of $SiH_4$ after the supply is started at time $t_1$ is gradually increased in any of various patterns, as described above, until time $t_2$ (=$t_3$), at which a steady state is reached.

By making the partial pressure of $SiH_4$ zero at the start of plasma discharge like this, excessive consumption of $SiH_4$ is prevented. With a $SiH_4$ supply method according to the invention, the $SiH_4$ supply rate in a first half side time constituting not more than half of the whole film deposition time is limited, and the partial pressure of $SiH_4$ is kept low from the start. By this means, the formation of a layer including excessive silicon in the silicon oxide film in the initial stage of deposition is prevented. The partial pressure characteristic 32, 42 of $O_2$ rises between the discharge start time and the time at which a steady state is reached.

What is claimed is:

1. A method for depositing a silicon oxide film in a deposition chamber divided from a plasma generation chamber, comprising:

a process gas supply step of supplying to said deposition chamber a process gas including silicon atoms;

a step of extracting radicals from said plasma generation chamber to said deposition chamber; and a step of depositing a silicon oxide film on a substrate by causing said process gas and said radicals to react,
   wherein in said process gas supplying step the supply flow rate of said process gas is, in a first period of time, not more than half of whole film deposition time, first made zero or limited and then gradually increased.

2. A method for depositing a silicon oxide film according to claim 1, wherein the process gas supply flow rate in the first period of time is limited so that the thickness of film deposited in said first period of time is not greater than 10% of the overall thickness of said silicon oxide film.

3. A method for depositing a silicon oxide film according to claim 1, wherein a silicon-hydrogen compound ($Si_nH_{2n+2}$ (n=1, 2, 3, . . . )) is used as said process gas.

4. A method for depositing a silicon oxide film according to claim 3, wherein an inert gas is introduced as a diluting gas along with said silicon-hydrogen compound process gas.

5. A method for depositing a silicon oxide film according to claim 1, wherein the rate of increase of said process gas supply rate is controlled with respect to time.

6. A method for depositing a silicon oxide film according to claim 1, wherein the rate of increase of said process gas supply rate is controlled in correspondence with a linear function.

7. A method for depositing a silicon oxide film according to claim 1, wherein the rate of increase of said process gas supply rate is controlled in correspondence with a second-order function.

8. A method for depositing a silicon oxide film according to claim 1, wherein the rate of increase of said process gas supply rate is controlled in correspondence with an exponential function.

9. A method for depositing a silicon oxide film according to claim 1, wherein the rate of increase of said process gas supply rate is controlled in correspondence with a step function.

10. A method for depositing a silicon oxide film according to claim 1, wherein the deposition rate of the silicon oxide film in said first period of time, being not more than half of the whole film deposition time, is not greater than 0.13 nm/sec.

11. A method for depositing a silicon oxide film according to claim 1, wherein any gas from among $O_2$, $O_3$, $N_2O$, CO, $CO_2$ and nitrogen oxide gases is used as a gas for making said radicals.

* * * * *